US009406702B2

(12) United States Patent
Wang

(10) Patent No.: US 9,406,702 B2
(45) Date of Patent: Aug. 2, 2016

(54) ARRAY SUBSTRATE, METHOD FOR FABRICATING THE SAME AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventor: Zhiyong Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/348,735

(22) PCT Filed: Jun. 9, 2013

(86) PCT No.: PCT/CN2013/077028
§ 371 (c)(1),
(2) Date: Mar. 31, 2014

(87) PCT Pub. No.: WO2014/153846
PCT Pub. Date: Oct. 2, 2014

(65) Prior Publication Data
US 2014/0291686 A1 Oct. 2, 2014

(30) Foreign Application Priority Data

Mar. 27, 2013 (CN) .......................... 2013 1 0100762

(51) Int. Cl.
H01L 27/12 (2006.01)
H01L 29/417 (2006.01)
(52) U.S. Cl.
CPC ........ H01L 27/124 (2013.01); H01L 29/41733 (2013.01)

(58) Field of Classification Search
CPC ..... G02F 1/1362; G02F 1/1368; H01L 21/77; H01L 27/12
USPC ....................... 257/59, 72; 438/157
See application file for complete search history.

(56) References Cited

U.S. PATENT DOCUMENTS

2007/0159571 A1* 7/2007 Yang ................. G02F 1/136259
349/54
2010/0033644 A1 2/2010 Hong et al.
2011/0069048 A1* 3/2011 Cao ....................... G02F 1/1309
345/204

FOREIGN PATENT DOCUMENTS

CN 101644863 A 2/2010
CN 101750809 A 6/2010
CN 201845777 U 5/2011

(Continued)

OTHER PUBLICATIONS

International Search Report for International Application No. PCT/CN2013/077028 issued Dec. 27, 2013, 12pgs.

(Continued)

Primary Examiner — Fernando L Toledo
Assistant Examiner — Lawrence-Linh T Nguyen
(74) Attorney, Agent, or Firm — Ladas & Parry LLP

(57) ABSTRACT

An array substrate, a method for fabricating the same and a display device as provided relate to the field of display technologies and can overcome the disadvantage of the gate-source capacitance being inconstant and prevent screen flicker, thereby improving the display effect of the display device. The array substrate comprises a plurality of pixel units (31) arranged into an array and a gate line (32) and a data line (33) disposed as intersecting each other and corresponding to each of the pixel units (31), each of the pixel units comprising a TFT region (311) and a pixel electrode region (312), the TFT region (311) comprises at least two TFTs (34, 35); a source electrode (341, 351) of each of the TFTs is electrically connected to the data line (33), a gate electrode (342, 352) of each of the TFTs is electrically connected to the gate line (32), a drain electrode (343, 353) of each of the TFTs is electrically connected to a pixel electrode (312).

11 Claims, 4 Drawing Sheets

(56) References Cited

FOREIGN PATENT DOCUMENTS

| CN | 101644863 B | 8/2011 |
|---|---|---|
| CN | 202196246 U | 4/2012 |

OTHER PUBLICATIONS

First Office Action issued by the Chinese Patent Office for Chinese Patent Application No. 201310100762.4 dated Jan. 26, 2015, eight (8) pages.

English translation of Third Office Action issued by the Chinese Patent Office for Chinese Patent Application No. 201310100762.4 dated Jan. 26, 2015, seven (7) pages.

English abstract of CH101750809A, one (1) page.

English abstract of CH101644863A, two (2) pages.

International Preliminary Report on Patentability issued Sep. 29, 2015; PCT/CN2013/077028.

\* cited by examiner

ARRAY SUBSTRATE, METHOD FOR FABRICATING THE SAME AND DISPLAY DEVICE

This application is based on International Application No. PCT/CN2013/077028 filed on Jun. 9, 2013, which claims priority to Chinese National Application No. 201310100762.4 filed on Mar. 27, 2013. The entire contents of each and every foregoing application are incorporated herein by reference.

FIELD OF THE ART

Embodiments of the invention relate to the field of display technologies, more particularly, to an array substrate, a method for fabricating the same and a display device.

BACKGROUND

In a Thin Film Transistor Liquid Crystal Display (TFT-LCD), there generally exists a capacitance between the gate electrode and the source electrode of the TFT switch. When the TFT is turned off, the gate voltage is switched from a high level to a low level. Due to existence of the gate-source capacitance, voltage at the pixel electrode is also pulled down by the capacitive coupling effect and therefore deviated from the voltage preset by the system. As illustrated in FIG. 1, when the gate voltage $V_G$ for driving the TFT is a positive voltage, the pixel voltage $V_p$ is smaller than the preset voltage value. In contrast, when the gate voltage $V_G$ for driving the TFT is a negative voltage, the pixel voltage $V_p$ is greater than the preset voltage value. Specifically, the pixel voltage $V_p$ is deviated from the preset voltage value by the following deviation amount:

$$\Delta V_p = (V_{GH} - V_{GL}) * C_{GS} / (C_{LC} + C_{ST} + C_{GS}) \quad \text{Equation 1}$$

The equivalent circuit of FIG. 1 is illustrated in FIG. 2. It is known from Equation 1 that the influence on the pixel voltage by the variation of gate voltage is mainly determined by the voltage difference between the turn-on and turn-off voltages of the gate electrode ($V_{GH}$, $V_{GL}$), the gate-source capacitance ($C_{GS}$), the liquid crystal capacitance ($C_{LC}$) and the storage capacitance ($C_{ST}$).

To overcome display defects caused by the pixel voltage deviation, conventional LCDs generally compensate the pixel voltage deviation by using the voltage of the common electrode (Vcom). As illustrated in FIG. 1, it may set Vcom as equal to $-\Delta V_p$, thereby eliminating the influence caused by the pixel voltage deviation. However, the method is deficient in that the gate-source capacitance $C_{GS}$ of the LCDs is not a constant, which will make the deviation amount of the pixel voltage $V_p$ relative to the preset voltage value varied. As a result, it is difficult to compensate the pixel voltage deviation by using a single common voltage, which will in turn affect rotation direction of the liquid crystal, thereby generating different transmittivity for liquid crystal molecules under the positive drive voltage and the negative drive voltage. In this way, due to the liquid crystal molecules in affected rotation direction, human eyes can perceive an obvious screen flicker. Screen flicker lasting for a long time will make the human eyes uncomfortable and adversely affecting the user experience.

SUMMARY

Embodiment of the invention provide an array substrate, a method for fabricating the same and a display device, which can overcome the disadvantage of the gate-source capacitance being inconstant and prevent screen flicker, thereby improving the display effect of the display device.

To achieve the above objectives, the following technical solutions are employed by the embodiments of the invention.

An aspect of the invention provides an array substrate, comprising a plurality of pixel units arranged as an array and a gate line and a data line disposed as intersecting each other and corresponding to each of the pixel units, each of the pixel units comprising a TFT region and a pixel electrode region, the TFT region comprises at least two TFTs;

a source electrode of each of the TFTs is electrically connected to the data line, a gate electrode of each of the TFTs is electrically connected to the gate line, a drain electrode of each of the TFTs is electrically connected to the pixel electrode.

Another aspect of the invention provides a display device comprising the above array substrate.

Still another aspect of the invention provides a method for fabricating an array substrate, comprising:

forming a gate line and a gate electrode layer on a transparent substrate, the gate electrode layer comprising at least two gate electrodes configured for at least two TFTs, the at least two gate electrodes are all electrically connected to the gate line;

sequentially forming a semiconductor active layer and a gate protection layer on a surface of each gate electrode;

forming a data line, a pixel electrode and a source/drain electrode layer on the substrate having the semiconductor active layer and the gate protection layer formed thereon, the source/drain electrode layer comprising at least two source electrodes and at least two drain electrodes for at least two TFTs, the at least two source electrodes are all electrically connected to the data line, the at least two drain electrodes are all electrically connected to the pixel electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 3b schematically illustrates a configuration of a pixel unit in the array substrate illustrated in FIG. 3a;

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Generally speaking, an embodiment of the invention provides an array substrate, comprising a plurality of pixel units arranged as an array and a gate line and a data line disposed as intersecting each other and corresponding to each of the pixel units, each of the pixel units further comprises a TFT region which comprises at least two TFTs, a source electrode of each TFT is electrically connected to the data line, a gate electrode of each TFT is electrically connected to the gate line, a drain electrode of each TFT is electrically connected to a pixel electrode. With such a multi-TFT configuration, gate-source capacitors of individual TFTs are connected in parallel, which makes the total gate-source capacitance constant, thereby overcoming the disadvantages of the gate-source capacitance of the TFT in conventional technologies being varied. By this means, a single common voltage can be used to effectively compensate the pixel voltage deviation, thereby preventing the screen from flickering, which will significantly improve the display effect of the display device.

Figure 1:
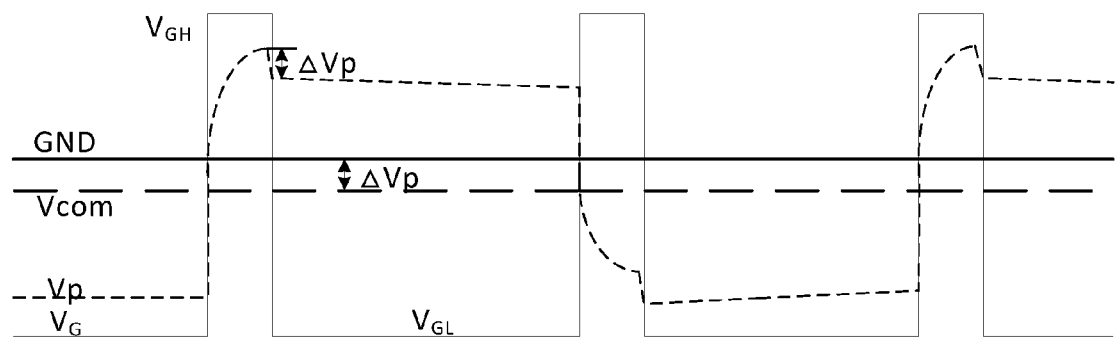
FIG. 1 schematically illustrates a waveform diagram of a drive signal for a conventional array substrate.
Figure 2:
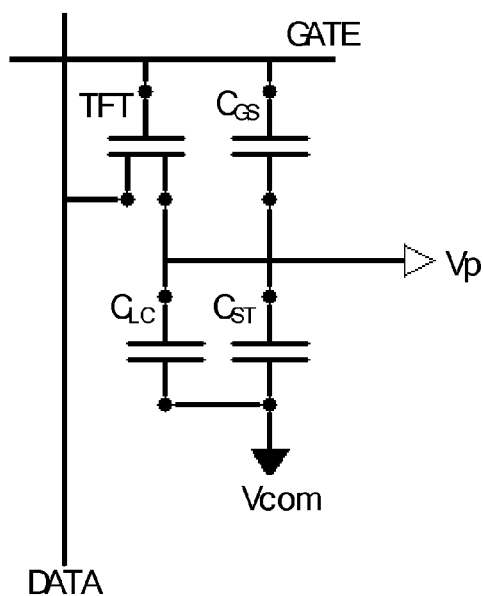
FIG. 2 schematically illustrates an equivalent circuit of a pixel unit in FIG. 1.
Figure 3A:
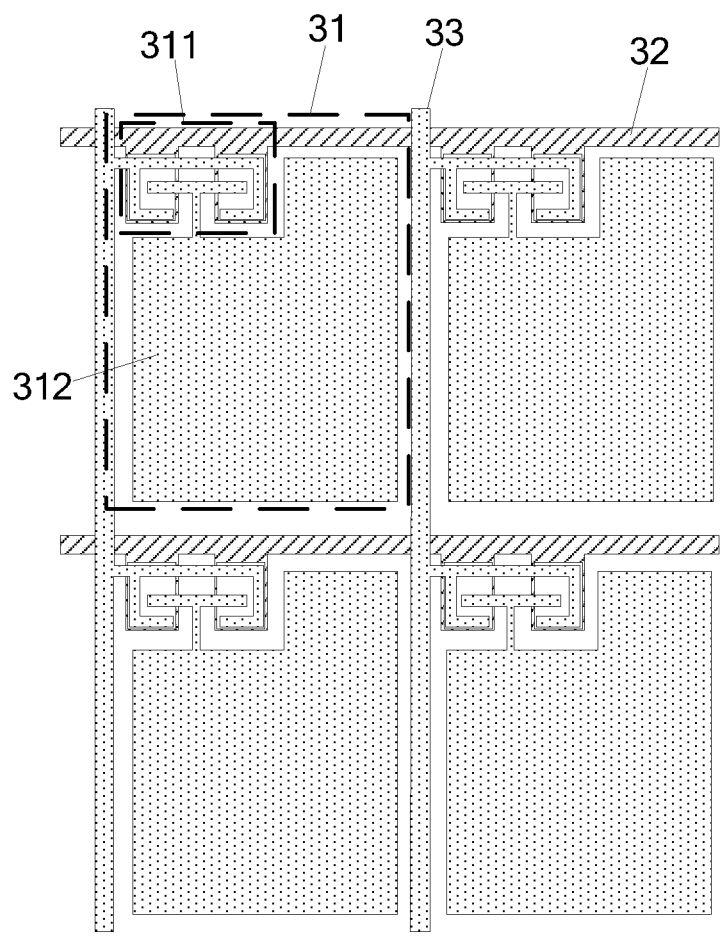
FIG. 3a schematically illustrates a configuration of an array substrate provided by an embodiment of the invention.
Figure 3B:
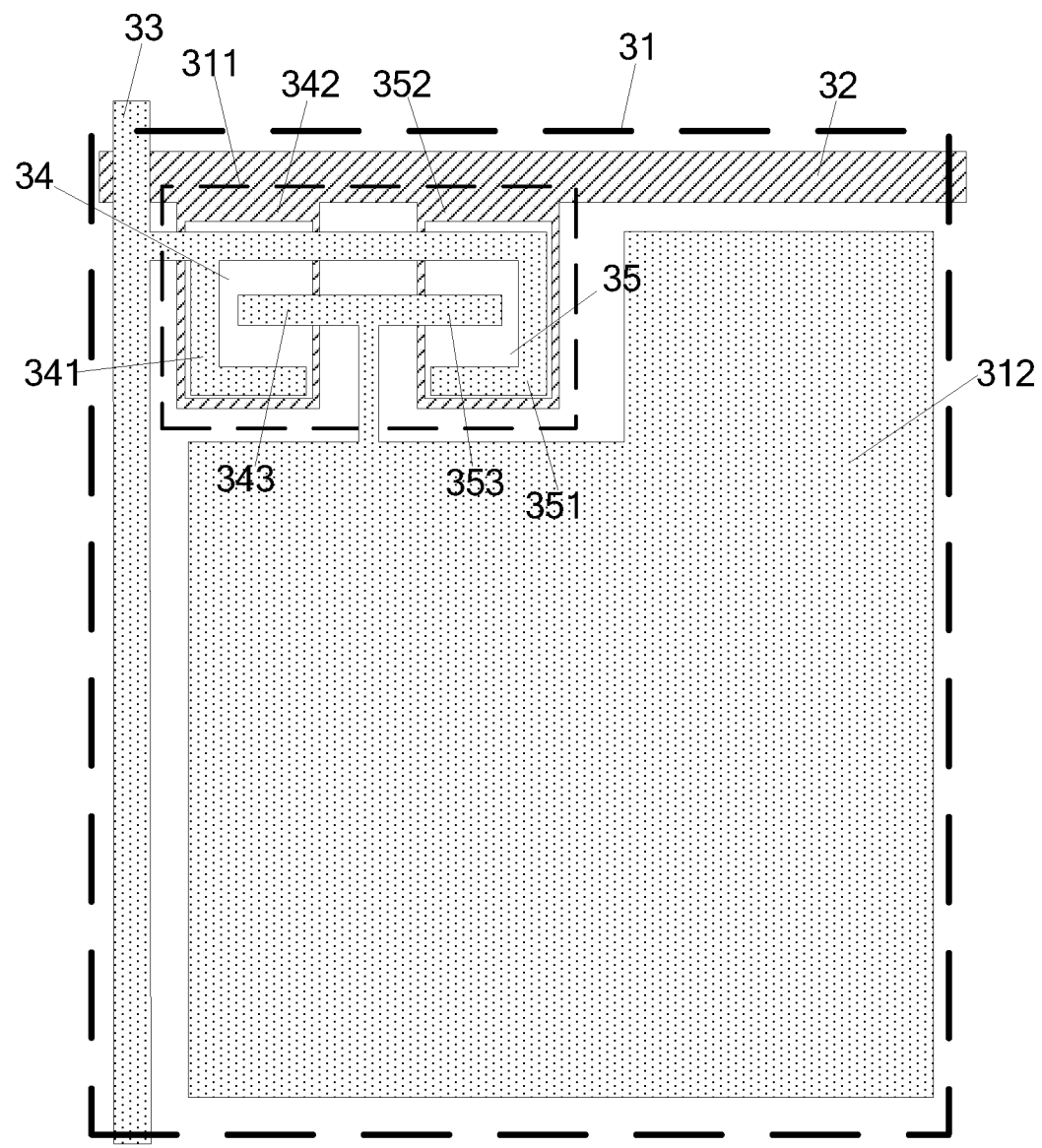

As an example, an embodiment of the invention provides an array substrate as illustrated in FIG. 3a, which comprises a plurality of pixel units 31 arranged as an array and a gate line 32 and a data line 33 disposed as intersecting each other and corresponding to each of the pixel units 31, each pixel unit 31 comprises a TFT region 311 and a pixel electrode region 312, wherein a configuration of the TFT region 311 is illustrated in FIG. 3b.

With reference to FIG. 3b, an example of the TFT region 311 having a first TFT 34 and a second TFT 35 disposed as opposed to each other will be described. It can be understood that the TFT region 311 comprising two TFTs is for illustrative purpose only and not to be construed as limitative to the embodiments of the invention. As an example, when an area of the TFT region 311 remains unchanged, a size of each TFT is decreased with the increase of the number of TFTs. When the number of TFTs is increased, precision of the mask exposure has to be increased so as to guarantee size precision of each TFT, which will increase not only the difficulty in fabricating the mask plate but also the requirement on the production process. With the dual-TFT configuration it can avoid the increasing difficulty in production caused by the size of the TFTs being too small.

In an embodiment of the invention, source electrodes (341, 351) of both the first TFT 34 and the second TFT 35 are electrically connected to the data line 33; gate electrodes (342, 352) of both the first TFT 34 and the second TFT 35 are electrically connected to the gate line 32; drain electrodes (343, 353) of both the first TFT 34 and the second TFT 35 are electrically connected to the pixel electrode 312.

Furthermore, the size of the first TFT 34 may be equal to that of the second TFT. As an example, both sizes of the first and second TFTs 34 and 35 may be equal to half of the area of the TFT region 311. Two TFTs with the same size have similar electrical property, with such a same-size dual-TFT design it may improve the uniformity of the two TFTs.

As the dual-TFT design is deployed in every pixel unit, in the case of the TFT size remaining the same, such a parallel dual-TFT design may double the turn-on current input to the pixel electrode. As a result, the size of the TFTs may be decreased accordingly under the condition of keeping the turn-on current unvaried. In comparison with the conventional technologies, effective power supply to the pixel electrode can also be realized without increasing the area of the TFT region. In this way, the aperture ratio of the array substrate is effectively guaranteed while the display effect of the display device is improved.

Furthermore, as illustrated in FIG. 3b, the source electrode 341 of the first TFT 34 and the source electrode 351 of the second TFT 35 may be an integral structure; the drain electrode 343 of the first TFT 34 and the drain electrode 353 of the second TFT 35 may be an integral structure.

As an example, during the fabrication process of the array substrate, the source electrode 341 of the first TFT 34 and the source electrode 351 of the second TFT 35 as well as the drain electrode 343 of the first TFT 34 and the drain electrode 353 of the second TFT 35 may be patterns which are formed of the same metal layer through a single patterning process. In this way, the difficulty in fabricating the mask plate corresponding to the patterns is significantly decreased, which further simplifies the production of the display device product.

Furthermore, the gate electrode 342 of the first TFT 34 and the gate electrode 352 of the second TFT 35 are not directly connected with each other (that is, there is a space therebetween), which helps to eliminate an undesired interference between the first TFT 34 and the second TFT 35, thereby guaranteeing the quality of the TFTs.

It is noted that in embodiments of the invention every TFT may have a "-" shaped TFT configuration or a "U" shaped TFT configuration, which is not limited by the invention.

As an example, in the array substrate illustrated in FIG. 3b, both the first TFT 34 and the second TFT 35 have a U-shaped TFT configuration, wherein the source electrode 341 of the first TFT 34 and the source electrode 351 of the second TFT 35 are disposed as the U shape being opposite to each other, the drain electrode 343 of the first TFT 34 and the drain electrode 353 of the second TFT 35 are respectively disposed in the U-shaped channel of its source electrode. In comparison with the "-" shaped TFT configuration, the U-shaped TFT configuration has a smaller gate-source capacitance while maintain the width-length ratio of the TFT, meanwhile, when the gate electrode layer and the source/drain electrode layer are misaligned vertically, the gate-source capacitance of the TFT will not change. Herein the gate electrode layer and the source/drain electrode layer being misaligned vertically refers to the source/drain electrode of the TFT moving along the direction of the data line with respect to the gate electrode layer. By this means, it further overcomes the disadvantage of the gate-source capacitance of the TFT being inconstant in conventional technologies.

During practical applications, a semiconductor layer and a gate protection layer are generally disposed between the gate electrode layer and the source/drain electrode layer of the TFT, which will form a capacitor between the gate and source electrodes of the TFT. The existence of the capacitor causes the voltage at the pixel electrode to be deviated from the preset voltage value due to the capacitive coupling effect of the capacitor. Herein, in terms of an equation for the capacitance of a parallel-plate capacitor, the capacitance between the gate and source electrodes of the TFT may be expressed as below:

$$C = \in S/d \qquad \text{Equation 2}$$

It is seen from Equation 2 that when both the thickness d of the dielectric layer and the permittivity $\in$ of the dielectric material between the capacitors remains the same, the gate-source capacitance of the TFT is proportional to the overlaying area S between the gate electrode layer and the source/drain electrode layer.

The U-shaped TFT configuration can maintain the width-length ratio while providing a quite small gate-source capacitance, the gate-source capacitance will not change even if the gate electrode layer and the source/drain electrode layer are misaligned vertically. When the gate electrode layer and the source/drain electrode layer are misaligned horizontally, the gate-source capacitance of such a multi-TFT configuration provided by the embodiment of the invention still remains the same, wherein the gate electrode layer and the source/drain electrode layer being misaligned horizontally refers to the source/drain electrode of the TFT moving along the direction of the gate line with respect to the gate electrode layer.

Figure 4:
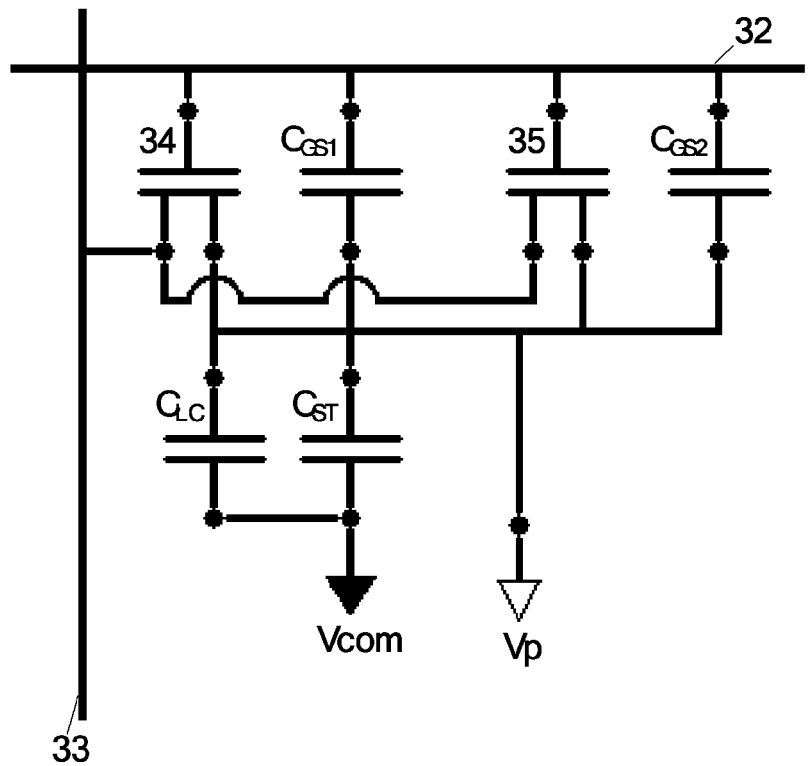
FIG. 4 schematically illustrates an equivalent circuit of a pixel unit in an array substrate provided by an embodiment of the invention.

The equivalent circuit of each pixel unit in the array substrate provided by the above embodiment of the invention is illustrated in FIG. 4, wherein the gate-source capacitance of the first TFT 34 is $C_{GS1}$, the gate-source capacitance of the second TFT 35 is $C_{GS2}$, the liquid crystal capacitance is $C_{LC}$, and the storage capacitance is $C_{ST}$. When the gate line 32 controls the TFTs to turn on, the data line 33 supplies power to the pixel electrode 312 via the illustrated dual-TFT configuration.

It is seen that the capacitor $C_{GS1}$ between the gate and source electrodes of the first TFT 34 and the capacitor $C_{GS2}$ between the gate and source electrodes of the second TFT 35 are connected in parallel and compensate each other. With the limitation of the fabrication process, the gate electrode layer and the source/drain electrode layer of the TFT is prone to be misaligned vertically or horizontally during the fabrication of the array substrate. The dual-TFT configuration provided by the embodiment of the invention can effectively prevent change in the gate-source capacitance caused by the vertical or horizontal misalignment present between the gate electrode layer and the source/drain electrode layer. For example, when the source/drain electrode layer of the TFT is shifted in the horizontal direction and further away from the first TFT 34 with respect to the gate electrode layer, the gate-source capacitance $C_{GS1}$ of the first TFT 34 will decrease with the decrease of the overlaying area between the upper and lower substrates; meanwhile, the gate-source capacitance $C_{GS2}$ of the second TFT 35 will increase with the increase of the overlaying area between the upper and lower substrates. As the capacitors $C_{GS1}$ and $C_{GS2}$ are connected in parallel, it is known from the parallel capacitor equation that the total capacitance $C_{GS}=C_{GS1}+C_{GS2}$ will remain the same.

With such a multi-TFT configuration, capacitors between the gate and source electrodes of individual TFTs are connected in parallel, which makes the total gate-source capacitance constant, thereby overcoming the disadvantages of the gate-source capacitance of the TFT in conventional technologies being varied. By this means, as illustrated in FIG. 4, a single common voltage Vcom can be used to effectively compensate the pixel voltage deviation, thereby preventing the screen from flickering, which will significantly improve the display effect of the display device.

An embodiment of the invention further provides a display device comprising any of the foregoing array substrate. The display device may be for example a mobile phone, a tablet PC, a television, a display monitor, a notebook, a camera, a video camera, a digital photo-frame, a navigator and any product or component having a display function.

As an example, the display device comprises an array substrate, the array substrate comprises a plurality of pixel units arranged as an array, a gate line and a data line disposed as intersecting each other and corresponding to each of the pixel units, each of the pixel units further comprises a TFT region which comprises at least two TFTs, the source electrode of each TFT is electrically connected to the data line, the gate electrode of each TFT is electrically connected to the gate line, the drain electrode of each TFT is electrically connected to a pixel electrode. With such a multi-TFT configuration, capacitors between the gate and source electrodes of individual TFTs are connected in parallel, which makes the total gate-source capacitance constant, thereby overcoming the disadvantages of the gate-source capacitance of the TFT in conventional technologies being varied. By this means, a single common voltage may be used to effectively compensate the pixel voltage deviation, thereby preventing the screen from flickering, which will significantly improve the display effect of the display device.

Figure 5:
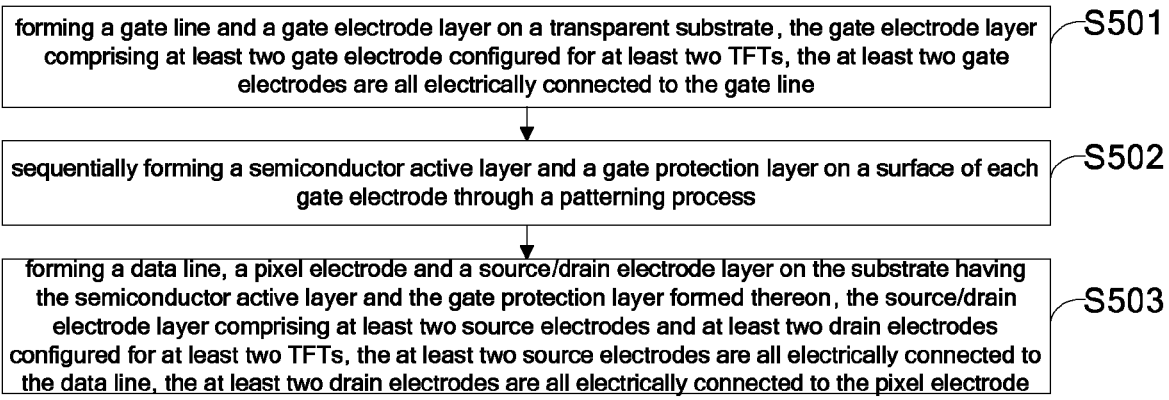
FIG. 5 schematically illustrates a flow chart of a method for fabricating an array substrate provided by an embodiment of the invention.

An embodiment of the invention further provides a method for fabricating an array substrate as illustrated in FIG. 5; the method comprises:

S501: forming a gate line and a gate electrode layer on a transparent substrate, the gate electrode layer comprising at least two gate electrode configured for at least two TFTs, the at least two gate electrodes are all electrically connected to the gate line;

S502: sequentially forming a semiconductor active layer and a gate protection layer on a surface of each gate electrode through a patterning process;

S503: forming a data line, a pixel electrode and a source/drain electrode layer on the substrate having the semiconductor active layer and the gate protection layer formed thereon, the source/drain electrode layer comprising at least two source electrodes and at least two drain electrodes configured for at least two TFTs, the at least two source electrodes are all electrically connected to the data line, the at least two drain electrodes are all electrically connected to the pixel electrode.

Furthermore, the gate electrode layer comprises two gate electrodes respectively configured for a first TFT and a second TFT disposed as opposed to each other.

Herein, the source electrodes of both the first TFT and the second TFT may be electrically connected to the data line, the gate electrodes of both the first TFT and the second TFT may be electrically connected to the gate line, the drain electrodes of both the first TFT and the second TFT may be electrically connected to the pixel electrode.

By this means, in condition that an area of the TFT region is a constant, a size of each TFT is decreased with the increase of the number of TFTs. With the dual-TFT configuration it can avoid the increasing difficulty in production caused by the size of the TFTs being too small. It can be understood that the TFT region comprising two TFTs are for illustrative purpose only and not to be construed as limitative to the embodiments of the invention.

Furthermore, the size of the first TFT may be equal to that of the second TFT. As an example, both sizes of the first and second TFTs may be equal to half of the area of the TFT region. Two TFTs with the same size have similar electrical property, with such a same-size dual-TFT design it can improve the uniformity of the two TFTs.

Furthermore, the source electrode of the first TFT and the source electrode of the second TFT may be an integral structure; the drain electrode of the first TFT and the drain electrode of the second TFT may be an integral structure.

Furthermore, the source electrode of the first TFT and the source electrode of the second TFT as well as the drain electrode of the first TFT and the drain electrode of the second TFT may be patterns which are formed of the same metal layer through a single patterning process. In this way, the difficulty in fabricating the mask plate corresponding to the patterns is significantly decreased, which further simplifies the production of the display device product.

Herein, the gate electrode of the first TFT and the gate electrode of the second TFT are not directly connected with each other, which helps to eliminate an undesired interference between the first TFT and the second TFT, thereby guaranteeing the quality of the TFTs.

It is noted that in embodiments of the invention every TFT may have a "-" shaped TFT configuration or a "U" shaped TFT configuration, which is not limited by the invention.

An array substrate having a multi-TFT configuration is obtained via the foregoing method, wherein capacitors between the gate and source electrodes of individual TFTs are connected in parallel, which makes the total gate-source capacitance constant, thereby overcoming the disadvantages of the gate-source capacitance of the TFT in conventional technologies being varied. By this means, a single common voltage can be used to effectively compensate the pixel voltage deviation, thereby preventing the screen from flickering, which will significantly improve the display effect of the display device.

The patterning process employed by the above embodiment generally comprises photoresist coating, exposing, developing, etching, photoresist peeling and the like.

What are described above is related to the illustrative embodiments of the disclosure only and not limitative to the scope of the disclosure; the scopes of the disclosure are defined by the accompanying claims.

What is claimed is:

1. An array substrate, comprising a plurality of pixel units arranged as an array and a gate line and a data line disposed as intersecting each other and corresponding to each of the pixel units, each of the pixel units comprising a TFT region and a pixel electrode region, wherein the TFT region comprises at least two TFTs;
   a source electrode of each of the TFTs is electrically connected to the data line, a gate electrode of each of the TFTs is electrically connected to the gate line, a drain electrode of each of the TFTs is electrically connected to the pixel electrode,
   the data line is disposed in a periphery of the pixel unit, and the TFT region is located at one side of the data line, wherein the at least two TFTs all have a U-shaped TFT configuration, the source electrodes of the at least two TFTs are disposed as U shapes with openings opposite to each other, the drain electrodes of the at least two TFTs are correspondingly disposed in U-shaped recesses of the source electrodes of the at least two TFTs.

2. The array substrate of claim 1, wherein the TFT region comprises two TFTs disposed opposed to each other.

3. The array substrate of claim 2, wherein the two TFTs are of a same size.

4. The array substrate of claim 1, wherein source electrodes of the at least two TFTs are an integral structure, drain electrodes of the at least two TFTs are an integral structure.

5. A display device comprising the array substrate of claim 1.

6. A method for fabricating an array substrate, comprising:
   forming a gate line and a gate electrode layer on a transparent substrate, the gate electrode layer comprising at least two gate electrodes configured for at least two TFTs, the at least two gate electrodes are all electrically connected to the gate line;
   sequentially forming a semiconductor active layer and a gate protection layer on a surface of each gate electrode;
   forming a data line, a pixel electrode and a source/drain electrode layer on the substrate having the semiconductor active layer and the gate protection layer formed thereon, wherein, the data line and the gate line are disposed as intersecting each other and corresponding to a pixel unit, the source/drain electrode layer comprises at least two source electrodes and at least two drain electrodes configured for at least two TFTs, the at least two source electrodes are all electrically connected to the data line, the at least two drain electrodes are all electrically connected to the pixel electrode, the data line is disposed in a periphery of the pixel unit, and the at least two TFTs are located at a same one side of the data line,
   wherein the at least two TFTs all have a U-shaped TFT configuration, the source electrodes of the at least two TFTs are disposed as U shapes with openings opposite to each other, the drain electrodes of the at least two TFTs are correspondingly disposed in U-shaped recesses of the source electrodes of the at least two TFTs.

7. The method of claim 6, wherein the gate electrode layer comprises two gate electrodes respectively configured for a first TFT and a second TFT disposed as opposed to each other.

8. The method of claim 7, wherein a size of the first TFT is equal to that of the second TFT.

9. The method of claim 7, wherein a source electrode of the first TFT and a source electrode of the second TFT are an integral structure, a drain electrode of the first TFT and a drain electrode of the second TFT are an integral structure.

10. The method of claim 9, wherein the source electrode of the first TFT and the source electrode of the second TFT are formed of a same metal layer through a single patterning process, the drain electrode of the first TFT and the drain electrode of the second TFT are formed of a same metal layer through a single patterning process.

11. The method of claim 8, wherein a source electrode of the first TFT and a source electrode of the second TFT are an integral structure, a drain electrode of the first TFT and a drain electrode of the second TFT are an integral structure.

* * * * *